United States Patent
Shima (10) Patent No.: US 8,263,859 B2
(45) Date of Patent: Sep. 11, 2012

(54) STACKED PHOTOVOLTAIC DEVICE

(75) Inventor: Masaki Shima, Uji (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 1270 days.

(21) Appl. No.: 11/412,042

(22) Filed: Apr. 27, 2006

(65) Prior Publication Data

US 2006/0249196 A1   Nov. 9, 2006

(30) Foreign Application Priority Data

Apr. 28, 2005   (JP) ................................. 2005-130654

(51) Int. Cl.
*H01L 31/0256* (2006.01)
(52) U.S. Cl. ........................................ 136/258; 136/243
(58) Field of Classification Search ........................ None
See application file for complete search history.

(56) References Cited

U.S. PATENT DOCUMENTS

| 5,403,404 | A | * | 4/1995 | Arya et al. | ..................... 136/249 |
| 6,399,873 | B1 | * | 6/2002 | Sano et al. | ..................... 136/249 |

FOREIGN PATENT DOCUMENTS

JP    2000-058892 A    2/2000

OTHER PUBLICATIONS

Remes, Z, M Vanecek, P Torres, U Kroll, A H. Mahan, and R S. Crandall. "Optical Determination of the Mass Density of Amorphous and Microcrystalline Silicon Layers with Different Hydrogen Content." Journal of Non-Crystalline Solids (1998): 876-879.*

* cited by examiner

*Primary Examiner* — Kaj K Olsen
*Assistant Examiner* — Kourtney Carlson
(74) *Attorney, Agent, or Firm* — NDQ&M Watchstone LLP

(57) ABSTRACT

An aspect of the present invention provides a stacked photovoltaic device that comprises a first power generating unit including a first semiconductor layer made of a substantially intrinsic non-single crystal semiconductor layer which functions as a photoelectric conversion layer; and a second power generating unit formed above the first power generating unit, the second power generating unit including a second semiconductor layer made of a substantially intrinsic non-crystalline semiconductor layer which functions as a photoelectric conversion layer. In the stacked photovoltaic device, a first density of an element mainly constituting the first semiconductor layer of the first power generating unit is lower than a second density of an element mainly constituting the second semiconductor layer of the second power generating unit.

9 Claims, 3 Drawing Sheets

STACKED PHOTOVOLTAIC DEVICE

CROSS REFERENCE TO RELATED APPLICATIONS

This application is based upon and claims the benefit of priority from the prior Japanese Patent Application No. P2005-130654 filed on Apr. 28, 2005, the entire contents of which are incorporated herein by reference.

BACKGROUND OF THE INVENTION

1. Field of the Invention

The present invention relates to a stacked photovoltaic device and more particularly to a stacked photovoltaic device including a plurality of power generating units.

2. Description of Related Art

Japanese Patent Application Laid-open No. 2000-58892 discloses a stacked photovoltaic device having a stacked structure in which a first power generating unit including a photoelectric conversion layer and a second power generating unit including a photoelectric conversion layer are stacked in sequence. This stacked photovoltaic device includes a thin film polycrystalline silicon layer or a microcrystalline silicon layer which acts as the photoelectric conversion layer of the first power generating unit, and an amorphous silicon layer which acts as the photoelectric conversion layer of the second power generating unit. Incidentally, output characteristics of the entire conventional stacked photovoltaic device mentioned above are determined according to a balance between the respective characteristics of the first power generating unit and the second power generating unit.

However, the conventional stacked photovoltaic device mentioned above has a disadvantage that a decreasing rate of characteristics of the second power generating unit alone becomes large, because the amorphous silicon layer that acts as the photoelectric conversion layer of the second power generating unit has a high rate of photodegradation. This disadvantage leads to another disadvantage of increasing the rate of photodegradation in the output characteristics of the entire stacked photovoltaic device including the first power generating unit and the second power generating unit. This results in a problem that a long-term use of the stacked photovoltaic device causes an increase in a range of variation in the output characteristics of the stacked photovoltaic device.

SUMMARY OF THE INVENTION

The invention is to provide a stacked photovoltaic device capable of reducing a range of variation in output characteristics thereof. An aspect of the present invention provides a stacked photovoltaic device that comprises a first power generating unit including a first semiconductor layer made of a substantially intrinsic non-single crystal semiconductor layer which functions as a photoelectric conversion layer; and a second power generating unit formed above the first power generating unit, the second power generating unit including a second semiconductor layer made of a substantially intrinsic non-crystalline semiconductor layer which functions as a photoelectric conversion layer. In the stacked photovoltaic device, a first density of an element mainly constituting the first semiconductor layer of the first power generating unit is lower than a second density of an element mainly constituting the second semiconductor layer of the second power generating unit.

In the stacked photovoltaic device according to this aspect, as described above, the second power generating unit including the second semiconductor layer made of the substantially intrinsic non-crystalline semiconductor layer, which functions as the photoelectric conversion layer, is formed above the first power generating unit including the first semiconductor layer made of the substantially intrinsic non-single crystal semiconductor layer, which functions as the photoelectric conversion layer. Moreover, the first density of the element mainly constituting the first semiconductor layer, made of the non-single crystal semiconductor layer, of the first power generating unit is lower than the second density of the element mainly constituting the second semiconductor layer, made of the non-crystalline semiconductor layer, of the second power generating unit. Thereby, the stacked photovoltaic device increases the amount of impurities incorporated in the first semiconductor layer (the photoelectric conversion layer), having the low first density, of the first power generating unit. Thus the stacked photovoltaic device lowers the initial characteristics of the first power generating unit alone including the first semiconductor layer (the photoelectric conversion layer) made of the non-single crystal semiconductor layer. Thus, it is possible to preset, at low values, initial output characteristics of the entire stacked photovoltaic device determined according to a balance between the respective characteristics of the first power generating unit and the second power generating unit. The initial output characteristics of the entire stacked photovoltaic device are preset at low values. Therefore, it is possible to reduce a rate of photodegradation in the output characteristics of the entire stacked photovoltaic device including the first power generating unit and the second power generating unit, even if there is a rise in the decreasing rate in the characteristics of the second power generating unit alone including the second semiconductor layer (the photoelectric conversion layer) made of the non-crystalline semiconductor layer that is prone to photodegradation. Thus, a slow decline in the output characteristics of the stacked photovoltaic device is made possible, and also a reduction in the range of variation in the output characteristics of the stacked photovoltaic device is made possible, in a long-term use of the stacked photovoltaic device.

In the stacked photovoltaic device according to the above-mentioned aspect, preferably, the first semiconductor layer of the first power generating unit and the second semiconductor layer of the second power generating unit include a silicon (Si) layer. With this configuration, the silicon density of the non-single crystal silicon layer which functions as the photoelectric conversion layer of the first power generating unit is lower than the silicon density of the non-crystalline silicon layer which functions as the photoelectric conversion layer of the second power generating unit. Thereby, it is possible to lower the initial characteristics of the first power generating unit alone including the non-single crystal silicon layer (the photoelectric conversion layer).

In the stacked photovoltaic device according to the above-mentioned aspect, the first semiconductor layer which functions as the photoelectric conversion layer of the first power generating unit includes, preferably, a microcrystalline semiconductor layer, and the second power generating unit including the second semiconductor layer made of a non-crystalline semiconductor layer which functions as the photoelectric conversion layer is, preferably, located at a light incident side. When the microcrystalline semiconductor layer that is not prone to photodegradation is used as the first semiconductor layer (the photoelectric conversion layer) of the first power generating unit as mentioned above, it is possible to prevent an occurrence of a disadvantage of excessively reducing the initial characteristics of the first power generating unit alone including the microcrystalline semiconductor layer (the photoelectric conversion layer), even if there is an increase in the amount of impurities incorporated in the microcrystalline semiconductor layer (the photoelectric conversion layer).

In the stacked photovoltaic device according to the above-mentioned aspect, a rate of photodegradation of the first semiconductor layer which functions as the photoelectric conversion layer of the first power generating unit is, preferably, lower than a rate of photodegradation of the second semiconductor layer which functions as the photoelectric conversion layer of the second power generating unit. Thereby, even when the density of the element mainly constituting the first semiconductor layer (the photoelectric conversion layer) of the first power generating unit is reduced to lower the initial characteristics and the rate of photodegradation of the first power generating unit alone, the decreased rate of photodegradation of the first power generating unit alone having a low rate of photodegradation has little effect on the rate of photodegradation of the entire stacked photovoltaic device, whereas the lowered initial characteristics of the first power generating unit alone have an effect of reducing the rate of photodegradation of the entire stacked photovoltaic device. Thus, it is possible to easily reduce the rate of photodegradation of the entire stacked photovoltaic device.

DETAILED DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Prepositions, such as "on", "over" and "above" are defined with respect to a surface, for example a layer surface, regardless of that surface's orientation in space. Preposition "above" may be used in the specification and claims even if a layer is in contact with another layer. Proposition "on" may be used in the specification and claims if a layer is not in contact with another layer, for example, there is an intervening layer between them.

Figure 1:
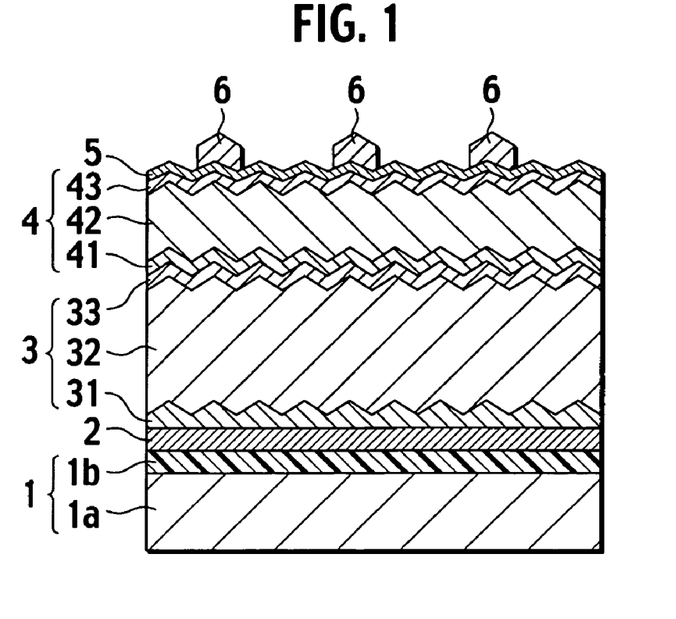
FIG. 1 is a sectional view showing a stacked photovoltaic device of an embodiment according to the present invention.

FIG. 1 is a sectional view showing an embodiment of a stacked photovoltaic device according to the present invention. Firstly, the description will be given with reference to FIG. 1 with regard to a structure of the stacked photovoltaic device according to the embodiment.

In the stacked photovoltaic device according to the embodiment, a resin layer 1b made of a polyimide resin with a thickness of 20 μm is formed on a flat stainless steel sheet (SUS430) 1a having a thickness of 0.15 mm, as shown in FIG. 1. A substrate 1 having a flat surface is configured of this stainless steel sheet 1a and this resin layer 1b. A flat rear electrode 2 made of silver (Ag) with a thickness of 200 nm is formed on the substrate 1 (the resin layer 1b).

The stacked photovoltaic device of the embodiment has a structure in which a bottom cell 3 and a front cell 4 are stacked in sequence on the rear face electrode 2. The bottom cell 3 acts as a microcrystalline silicon system power generating unit, and the front cell 4 acts as an amorphous silicon system power generating unit. The bottom cell 3 is located at a substrate 1 side, and the front cell 4 is located at a light incident side. Incidentally, the bottom cell 3 is an example of a "first power generating unit" of the present invention, and the front cell 4 is an example of a "second power generating unit" of the present invention.

Specifically, an n-type layer 31 made of an n-type microcrystalline silicon layer, a photoelectric conversion layer 32 made of an undoped microcrystalline silicon layer, and a p-type layer 33 made of a p-type microcrystalline silicon layer are formed in sequence on the rear face electrode 2. In the embodiment, the n-type layer 31, the photoelectric conversion layer 32, and the p-type layer 33 are 20 nm, 2 μm, and 20 nm, respectively, in thickness. Incidentally, the photoelectric conversion layer 32 is an example of a "first semiconductor layer" of the present invention. The bottom cell 3 is configured of the n-type layer 31, the photoelectric conversion layer 32 and the p-type layer 33.

In the embodiment, the stacked photovoltaic device is configured in such a manner that a silicon density of the photoelectric conversion layer (a microcrystalline silicon layer) 32 of the bottom cell 3 is lower than that of a photoelectric conversion layer (an amorphous silicon layer) 42 of the front cell 4 to be described later. Specifically, the silicon density of the photoelectric conversion layer (the microcrystalline silicon layer) 32 of the bottom cell 3 is set at 2.267 g/cm$^3$, and the silicon density of the photoelectric conversion layer (the amorphous silicon layer) 42 of the front cell 4 is set at 2.315 g/cm$^3$.

An n-type layer 41 made of an n-type microcrystalline silicon layer, the photoelectric conversion layer 42 made of the undoped amorphous silicon layer, and a p-type layer 43 made of a p-type amorphous silicon carbide (SiC) layer are formed in sequence on the bottom cell 3 (the p-type layer 33). The n-type layer 41, the photoelectric conversion layer 42, and the p-type layer 43 are 20 nm, 350 nm, and 20 nm, respectively, in thickness. Incidentally, the photoelectric conversion layer 42 is an example of a "second semiconductor layer" of the present invention. The front cell 4 is configured of the n-type layer 41, the photoelectric conversion layer 42 and the p-type layer 43.

When the amorphous silicon layer and the microcrystalline silicon layer are used as the photoelectric conversion layers, the amorphous silicon layer is known to be more prone to undergo photodegradation than the microcrystalline silicon layer. Thus, in the embodiment, a rate of photodegradation of the photoelectric conversion layer (the microcrystalline silicon layer) 32 of the bottom cell 3 is lower than that of the photoelectric conversion layer (the amorphous silicon layer) 42 of the front cell 4, even if the silicon density of the photoelectric conversion layer (the microcrystalline silicon layer) 32 of the bottom cell 3 is lower than that of the photoelectric conversion layer (the amorphous silicon layer) 42 of the front cell 4.

A front face transparent electrode 5 with a thickness of 80 nm made of ITO (Indium Tin Oxide) is formed on the front cell 4 (the p-type layer 43). Collector electrodes 6 made of silver with a thickness of 2 μm are formed on predetermined regions of the front face transparent electrode 5.

(Fabrication of the Stacked Photovoltaic Device)

The description will now be given with regard to a process for fabricating the stacked photovoltaic device when the stacked photovoltaic device is actually fabricated according to the embodiment. First, the resin layer 1b made of the polyimide resin with a thickness of 20 μm was vapor deposited and polymerized on the flat stainless steel sheet 1a having a thickness of 0.15 mm, as shown in FIG. 1. This yields the substrate 1 configured of the stainless steel sheet 1a and the resin layer 1b. Next, the flat rear electrode 2 made of silver with the thickness of 200 nm was formed on the substrate 1 (the resin layer 1b) using RF (radio-frequency) magnetron sputtering method.

Next, three silicon layers to constitute the bottom cell 3 were formed in sequence on the rear face electrode 2 using plasma CVD (chemical vapor deposition) method. Specifically, the n-type layer 31 made of the n-type microcrystalline silicon layer, the photoelectric conversion layer 32 made of the undoped microcrystalline silicon layer, and the p-type layer 33 made of the p-type microcrystalline silicon layer were formed in sequence on the rear face electrode 2. In this instance, the n-type layer 31, the photoelectric conversion layer 32, and the p-type layer 33 were formed with a thickness of 20 nm, 2 μm, and 20 nm, respectively. Conditions for forming the n-type layer 31, the photoelectric conversion layer 32 and the p-type layer 33 are shown in Table 1 given below.

TABLE 1

| Embodiment | | Substrate temperature (° C.) | Reaction pressure (Pa) | RF power (W) | Gas flow rate (sccm) |
|---|---|---|---|---|---|
| Bottom cell | N-type layer | 160 | 133 | 100 | $SiH_4$: 3<br>$H_2$: 200<br>$PH_3$: 0.06 |
| | Photoelectric conversion layer | 200 | 133 | 30 | $SiH_4$: 20<br>$H_2$: 400 |
| | P-type layer | 160 | 133 | 60 | $SiH_4$: 2<br>$H_2$: 400<br>$B_2H_6$: 0.02 |

Referring to Table 1, the substrate temperature, the reaction pressure, and the radio-frequency (RF) power were set at 160 degrees, 133 Pa, and 100 W, respectively, to form the n-type layer 31 made of the n-type microcrystalline silicon layer. Moreover, to form the n-type layer 31, the gas flow rates of silane ($SiH_4$) gas, hydrogen ($H_2$) gas, and phosphine ($PH_3$) gas were set at 3 sccm, 200 sccm, and 0.06 sccm, respectively.

The substrate temperature, the reaction pressure, and the radio-frequency power were set at 200 degrees, 133 Pa, and 30 W, respectively, to form the photoelectric conversion layer 32 made of the undoped microcrystalline silicon layer. Moreover, to form the photoelectric conversion layer 32, the gas flow rates of $SiH_4$ gas and $H_2$ gas were set at 20 sccm and 400 sccm, respectively.

The substrate temperature, the reaction pressure, and the radio-frequency power were set at 160 degrees, 133 Pa, and 60 W, respectively, to form the p-type layer 33 made of the p-type microcrystalline silicon layer. Moreover, to form the p-type layer 33, the gas flow rates of $SiH_4$ gas, $H_2$ gas, and diborane ($B_2H_6$) gas were set at 2 sccm, 400 sccm, and 0.02 sccm, respectively.

Next, three silicon layers to constitute the front cell 4 were formed in sequence on the bottom cell 3 (the p-type layer 33) using plasma CVD method. Specifically, the n-type layer 41 made of the n-type microcrystalline silicon layer, the photoelectric conversion layer 42 made of the undoped amorphous silicon layer, and the p-type layer 43 made of the p-type amorphous silicon carbide layer were formed in sequence on the bottom cell 3. In this instance, the n-type layer 41, the photoelectric conversion layer 42, and the p-type layer 43 were formed with a thickness of 20 nm, 350 nm, and 20 nm, respectively. The conditions for forming the n-type layer 41, the photoelectric conversion layer 42 and the p-type layer 43 are shown in Table 2 given below.

TABLE 2

| Embodiment | | Substrate temperature (° C.) | Reaction pressure (Pa) | RF power (W) | Gas flow rate (sccm) |
|---|---|---|---|---|---|
| Front cell | N type layer | 160 | 133 | 100 | $SiH_4$: 3<br>$H_2$: 200<br>$PH_3$: 0.06 |
| | Photoelectric conversion layer | 160 | 11 | 5 | $SiH_4$: 30 |
| | P type layer | 160 | 33 | 10 | $SiH_4$: 10<br>$H_2$: 90<br>$CH_4$: 10<br>$B_2H_6$: 0.4 |

Referring to Table 2, the substrate temperature, the reaction pressure, and the radio-frequency power were set at 160 degrees, 133 Pa, and 100 W, respectively, to form the n-type layer 41 made of the n-type microcrystalline silicon layer. Moreover, to form the n-type layer 41, the gas flow rates of $SiH_4$ gas, $H_2$ gas, and $PH_3$ gas were set at 3 sccm, 200 sccm, and 0.06 sccm, respectively.

The substrate temperature, the reaction pressure, and the radio-frequency power were set at 160 degrees, 11 Pa, and 5 W, respectively, to form the photoelectric conversion layer 42 made of the undoped amorphous silicon layer. Moreover, to form the photoelectric conversion layer 42, the gas flow rate of $SiH_4$ gas was set at 30 sccm.

The substrate temperature, the reaction pressure, and the radio-frequency power were set at 160 degrees, 33 Pa, and 10 W, respectively, to form the p-type layer 43 made of the p-type amorphous silicon carbide layer. Moreover, to form the p-type layer 43, the gas flow rates of $SiH_4$ gas, $H_2$ gas, methane ($CH_4$) gas, and $B_2H_6$ gas were set at 10 sccm, 90 sccm, 10 sccm, and 0.4 sccm, respectively.

Next, the front face transparent electrode 5 made of ITO with a thickness of 80 nm was formed on the front cell 4 (the p-type layer 43) using RF magnetron sputtering method. Next, the collector electrodes 6 made of silver with a thickness of 2 μm were formed on predetermined regions of the front face transparent electrode 5 using vacuum vapor deposition method. This yields the stacked photovoltaic device according to the embodiment.

Next, measurements were made on the stacked photovoltaic device according to the embodiment fabricated in the manner as above mentioned, to determine the silicon density of the photoelectric conversion layer (the microcrystalline silicon layer) 32 of the bottom cell 3 and the silicon density of the photoelectric conversion layer (the amorphous silicon layer) 42 of the front cell 4. The measured silicon densities are shown in Table 3 as given below. Incidentally, X-ray reflectivity measurement equipment (S-MAT (Semiconductor Materials Analysis Tool) commercially available from Technos Co., Ltd.) was used for silicon density measurement. The conditions of the silicon density measurement using the X-ray reflectivity measurement equipment were set as follows: irradiated X-ray was $CuK_\alpha$, a measuring range was such that 2 (theta) was set from 0.16 to 0.25 degree (in increments of 0.0002 degree), and a slit width was 10 mm.

TABLE 3

| | Silicon density of photoelectric conversion layer (g/cm³) | |
|---|---|---|
| | Front cell | Bottom cell |
| Embodiment | 2.315 | 2.267 |

Referring to Table 3, the silicon density of the photoelectric conversion layer (the microcrystalline silicon layer) 32 of the bottom cell 3 of the embodiment was 2.267 g/cm³, and the silicon density of the photoelectric conversion layer (the amorphous silicon layer) 42 of the front cell 4 of the embodiment was 2.315 g/cm³. The above results have confirmed that, in the embodiment, the silicon density (2.267 g/cm³) of the photoelectric conversion layer (the microcrystalline silicon layer) 32 of the bottom cell 3 is lower than the silicon density (2.315 g/cm³) of the photoelectric conversion layer (the amorphous silicon layer) 42 of the front cell 4.

COMPARATIVE EXAMPLE 1

Figure 2:
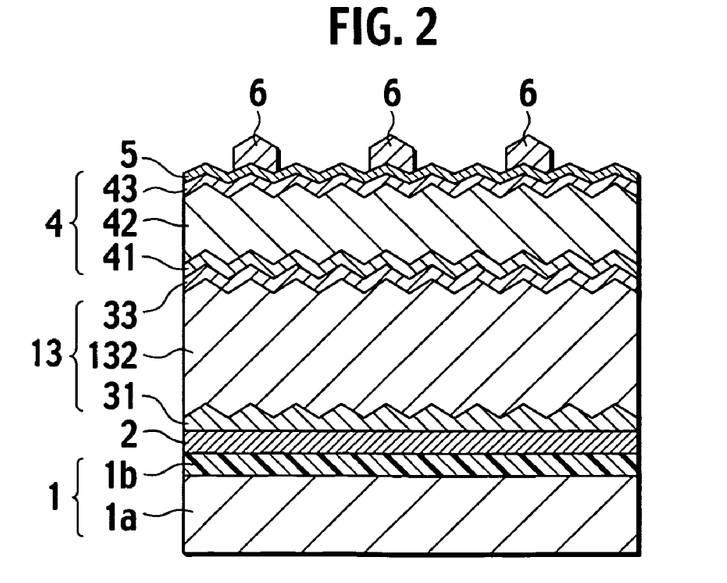
FIG. 2 is a sectional view showing the structure of a stacked photovoltaic device according to a comparative example 1.

FIG. 2 is a sectional view showing the structure of a stacked photovoltaic device according to a comparative example 1. The description will now be given with reference to FIG. 2 with regard to a process for fabricating the stacked photovoltaic device according to the comparative example 1, which has been fabricated as a comparative example relative to the above-mentioned embodiment. Note that the structure of the stacked photovoltaic device according to the comparative example 1 is the same as that of the stacked photovoltaic device according to the embodiment as described above, except that the silicon density (2.323 g/cm³) of a photoelectric conversion layer (the microcrystalline silicon layer) 132 of a bottom cell 13 of the comparative example 1 is higher than the silicon density (2.267 g/cm³) of the photoelectric conversion layer (the microcrystalline silicon layer) 32 of the bottom cell 3 of the embodiment. In other words, the stacked photovoltaic device of the comparative example 1 is configured in such a manner that the silicon density of the photoelectric conversion layer (the microcrystalline silicon layer) 132 of the bottom cell 13 is higher than that of the photoelectric conversion layer (the amorphous silicon layer) 42 of the front cell 4, as distinct from the stacked photovoltaic device of the embodiment.

(Fabrication of Stacked Photovoltaic Device)

First, as shown in FIG. 2, a resin layer 1b made of polyimide resin with a thickness of 20 μm was vapor deposited and polymerized on a stainless steel sheet 1a with a thickness of 0.15 mm, thereby fabricating a substrate 1, as in the case of the above-mentioned embodiment. Next, a rear face electrode 2 made of silver with a thickness of 200 nm was formed on the substrate 1 using RF magnetron sputtering method.

Next, the bottom cell 13 formed of three silicon layers was formed on the rear face electrode 2 using a plasma CVD method. Specifically, an n-type layer 31 made of an n-type microcrystalline silicon layer, a photoelectric conversion layer 132 made of an undoped microcrystalline silicon layer, and a p-type layer 33 made of a p-type microcrystalline silicon layer were formed in sequence on the rear face electrode 2. In this instance, the n-type layer 31, the photoelectric conversion layer 132, and the p-type layer 33 were formed with a thickness of 20 nm, 2 μm, and 20 nm, respectively. The conditions for forming the n-type layer 31, the photoelectric conversion layer 132 and the p-type layer 33 are shown in Table 4 given below.

TABLE 4

| Comparative example 1 | | Substrate temperature (° C.) | Reaction pressure (Pa) | RF power (W) | Gas flow rate (sccm) |
|---|---|---|---|---|---|
| Bottom cell | N-type layer | 160 | 133 | 100 | $SiH_4$: 3<br>$H_2$: 200<br>$PH_3$: 0.06 |
| | Photoelectric conversion layer | 200 | 133 | 50 | $SiH_4$: 10<br>$H_2$: 400 |
| | P-type layer | 160 | 133 | 60 | $SiH_4$: 2<br>$H_2$: 400<br>$B_2H_6$: 0.02 |

Referring to Table 4, the substrate temperature, the reaction pressure, and the radio-frequency power were set at 160 degrees, 133 Pa, and 100 W, respectively, to form the n-type layer 31 made of the n-type microcrystalline silicon layer. Moreover, to form the n-type layer 31, the gas flow rates of $SiH_4$ gas, $H_2$ gas, $PH_3$ gas were set at 3 sccm, 200 sccm, and 0.06 sccm, respectively. Incidentally, the conditions for forming the n-type layer 31 of the comparative example 1 are the same as the conditions of formation for the n-type layer 31 of the above-mentioned embodiment.

The substrate temperature, the reaction pressure, and the radio-frequency power were set at 200 degrees, 133 Pa, and 50 W, respectively, to form the photoelectric conversion layer 132 made of the undoped microcrystalline silicon layer. To form the photoelectric conversion layer 132, the gas flow rates of $SiH_4$ gas and $H_2$ gas were set at 10 sccm and 400 sccm, respectively.

The substrate temperature, the reaction pressure, and the radio-frequency power were set at 160 degrees, 133 Pa, and 60 W, respectively, to form the p-type layer 33 made of the p-type microcrystalline silicon layer. Moreover, to form the p-type layer 33, the gas flow rates of $SiH_4$ gas, $H_2$ gas, and $B_2H_6$ gas were set at 2 sccm, 400 sccm, and 0.02 sccm, respectively. Incidentally, the conditions for forming the p-type layer 33 of the comparative example 1 are the same as the conditions for forming the p-type layer 33 of the above-mentioned embodiment.

Next, three silicon layers to constitute the front cell 4 were formed in sequence on the bottom cell 13 (the p-type layer 33) using the plasma CVD method. Specifically, an n-type layer 41 made of an n-type microcrystalline silicon layer, the photoelectric conversion layer 42 made of an undoped amorphous silicon layer, and a p-type layer 43 made of a p-type amorphous silicon carbide layer were formed in sequence on the bottom cell 13. In this instance, the n-type layer 41, the photoelectric conversion layer 42, and the p-type layer 43 were formed with a thickness of 20 nm, 350 nm, and 20 nm, respectively. The same conditions of formation as shown in Table 2 were used to form the n-type layer 41, the photoelectric conversion layer 42 and the p-type layer 43.

Next, a front face transparent electrode 5 made of ITO with a thickness of 80 nm was formed on the front cell 4 (the p-type layer 43) using RF magnetron sputtering method, as in the case of the above-mentioned embodiment. Next, collector electrodes 6 made of silver with a thickness of 2 μm were formed on predetermined regions of the front face transparent electrode using the vacuum evaporation method. In this manner, the stacked photovoltaic device according to the comparative example 1 is fabricated. In the stacked photovoltaic device of the comparative example 1, light is incident from a front cell 4 side as in the case of the above-mentioned embodiment.

Next, a measurement was made on the stacked photovoltaic device according to the comparative example 1 fabricated in the manner as above mentioned, to determine a silicon density of the photoelectric conversion layer (the microcrystalline silicon layer) 132 of the bottom cell 13. The same measurement conditions as for the silicon densities of the photoelectric conversion layer 32 of the bottom cell 3 and the photoelectric conversion layer 42 of the front cell 4 of the above-mentioned embodiment were used to measure the silicon density of the photoelectric conversion layer 132 of the bottom cell 13 of the comparative example 1. The measured silicon density is shown in Table 5 given below. The photoelectric conversion layer 42 of the front cell 4 of the comparative example 1 and the photoelectric conversion layer 42 of the front cell 4 of the embodiment are considered to have an equal silicon density (2.315 g/cm$^3$), because the conditions for forming the photoelectric conversion layer 42 of the front cell 4 of the comparative example 1 are the same as the conditions for forming the photoelectric conversion layer 42 of the front cell 4 of the above-mentioned embodiment. Therefore, a measurement was not made of the silicon density of the photoelectric conversion layer 42 of the front cell 4 of the comparative example 1.

TABLE 5

|  | Silicon density of photoelectric conversion layer (g/cm$^3$) | |
| --- | --- | --- |
|  | Front cell | Bottom cell |
| Comparative example 1 | 2.315 | 2.323 |

Referring to Table 5, the silicon density of the photoelectric conversion layer (the microcrystalline silicon layer) 132 of the bottom cell 13 of the comparative example 1 was 2.323 g/cm$^3$. The result has shown that, in the comparative example 1, the silicon density (2.323 g/cm$^3$) of the photoelectric conversion layer (the microcrystalline silicon layer) 132 of the bottom cell 13 is higher than the silicon density (2.315 g/cm$^3$) of the photoelectric conversion layer (the amorphous silicon layer) 42 of the front cell 4.

COMPARATIVE EXAMPLE 2

Figure 3:
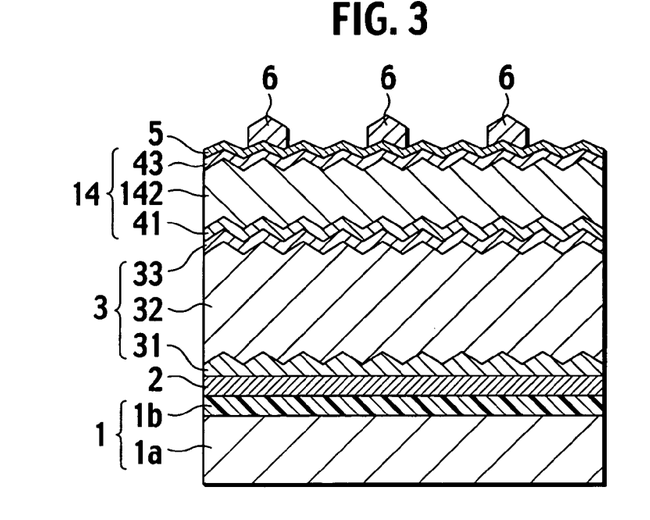
FIG. 3 is a sectional view showing a structure of a stacked photovoltaic device according to a comparative example 2.

FIG. 3 is a sectional view showing a structure of a stacked photovoltaic device according to a comparative example 2. The description will now be given with reference to FIG. 3 with regard to a process for fabricating the stacked photovoltaic device according to the comparative example 2, which has been fabricated as a comparative example relative to the above-mentioned embodiment. Note that the structure of the stacked photovoltaic device according to the comparative example 2 is the same as that of the stacked photovoltaic device according to the above-mentioned embodiment, except that a silicon density (2.231 g/cm$^3$) of a photoelectric conversion layer (an amorphous silicon layer) 142 of a front cell 14 of the comparative example 2 is lower than the silicon density (2.315 g/cm$^3$) of the photoelectric conversion layer (the amorphous silicon layer) 42 of the front cell 4 of the above-mentioned embodiment. In other words, the stacked photovoltaic device of the comparative example 2 is configured in such a manner that a silicon density of a photoelectric conversion layer (a microcrystalline silicon layer) 32 of a bottom cell 3 is higher than the silicon density of the photoelectric conversion layer (the amorphous silicon layer) 142 of the front cell 14, as distinct from the stacked photovoltaic device of the above-mentioned embodiment.

(Fabrication of Stacked Photovoltaic Device)

First, as shown in FIG. 3, a resin layer 1b made of a polyimide resin with a thickness of 20 μm was vapor deposited and polymerized on a stainless steel sheet 1a with a thickness of 0.15 mm, thereby fabricating a substrate 1, as in the case of the above-mentioned embodiment. Next, a rear face electrode 2 made of silver with a thickness of 200 nm was formed on the substrate 1 using the RF magnetron sputtering method.

Next, the bottom cell 3 made of three silicon layers was formed on the rear face electrode 2 using the plasma CVD method. Specifically, an n-type layer 31 made of an n-type microcrystalline silicon layer, the photoelectric conversion layer 32 made of an undoped microcrystalline silicon layer, and a p-type layer 33 made of a p-type microcrystalline silicon layer were formed in sequence on the rear face electrode 2. In this instance, the n-type layer 31, the photoelectric conversion layer 32, and the p-type layer 33 were formed with a thickness of 20 nm, 2 μm, and 20 nm, respectively. The same conditions of formation as shown in Table 1 were used to form the n-type layer 31, the photoelectric conversion layer 32 and the p-type layer 33.

Next, three silicon layers to constitute the front cell 14 were formed in sequence on the bottom cell 3 (the p-type layer 33) using the plasma CVD method. Specifically, an n-type layer 41 made of an n-type microcrystalline silicon layer, the photoelectric conversion layer 142 made of an undoped amorphous silicon layer, and a p-type layer 43 made of a p-type amorphous silicon carbide layer were formed in sequence on the bottom cell 3. In this instance, the n-type layer 41, the photoelectric conversion layer 142, and the p-type layer 43 were formed with a thickness of 20 nm, 350 nm, and 20 nm, respectively. The conditions for forming the n-type layer 41, the photoelectric conversion layer 142 and the p-type layer 43 are shown in Table 6 as given below.

TABLE 6

|  | Comparative example 2 | Substrate temperature (° C.) | Reaction pressure (Pa) | RF power (W) | Gas flow rate (sccm) |
| --- | --- | --- | --- | --- | --- |
| Front cell | N-type layer | 160 | 133 | 100 | SiH$_4$: 3<br>H$_2$: 200<br>PH$_3$: 0.06 |
|  | Photoelectric conversion layer | 160 | 650 | 50 | SiH$_4$: 30<br>H$_2$: 150 |
|  | P-type layer | 160 | 33 | 10 | SiH$_4$: 10<br>H$_2$: 90<br>CH$_4$: 10<br>B$_2$H$_6$: 0.4 |

Referring to Table 6, the substrate temperature, the reaction pressure, and the radio-frequency power were set at 160 degrees, 133 Pa, and 100 W, respectively, to form the n-type layer 41 made of the n-type microcrystalline silicon layer. Moreover, to form the n-type layer 41, the gas flow rates of SiH$_4$ gas, H$_2$ gas, and PH$_3$ gas were set at 3 sccm, 200 sccm, and 0.06 sccm, respectively. Incidentally, the conditions for forming the n-type layer 41 of the comparative example 2 are the same as the conditions for forming the n-type layer 41 of the above-mentioned embodiment.

The substrate temperature, the reaction pressure, and the radio-frequency power were set at 160 degrees, 650 Pa, and 50 W, respectively, to form the photoelectric conversion layer 142 made of the undoped amorphous silicon layer. To form the photoelectric conversion layer 142, the gas flow rates of SiH$_4$ gas and H$_2$ gas were set at 30 sccm and 150 sccm, respectively.

The substrate temperature, the reaction pressure, and the radio-frequency power were set at 160 degrees, 33 Pa, and 10 W, respectively, to form the p-type layer 43 made of the p-type amorphous silicon carbide layer. To form the p-type layer 43, the gas flow rates of SiH$_4$ gas, H$_2$ gas, CH$_4$ gas, and B$_2$H$_6$ gas were set at 10 sccm, 90 sccm, 10 sccm, and 0.4 sccm, respectively. Incidentally, the conditions for forming the p-type layer 43 of the comparative example 2 are the same as the conditions of formation for the p-type layer 43 of the above-mentioned embodiment.

Next, a front face transparent electrode 5 made of ITO with a thickness of 80 nm was formed on the front cell 14 (the p-type layer 43) using the RF magnetron sputtering method, as in the case of the above-mentioned embodiment. Next, collector electrodes 6 made of silver with a thickness of 2 μm were formed in predetermined regions of the front face transparent electrode 5 using the vacuum vapor deposition method. In this manner, the stacked photovoltaic device according to the comparative example 2 was fabricated. Incidentally, in the stacked photovoltaic device of the comparative example 2, light is incident from a front cell 14 side, as in the case of the stacked photovoltaic device of the above-mentioned embodiment.

Next, a measurement was made on the stacked photovoltaic device according to the comparative example 2 fabricated in the manner as above mentioned, to determine a silicon density of the photoelectric conversion layer (the amorphous silicon layer) 142 of the front cell 14. The same measurement conditions as the measurement conditions for the silicon densities of the photoelectric conversion layers 32 and 42 of the bottom cell 3 and front cell 4 of the above-mentioned embodiment were used to measure the silicon density of the photoelectric conversion layer 142 of the front cell 14 of the comparative example 2. The measured silicon density is shown in Table 7 as given below. The photoelectric conversion layer 32 of the bottom cell 3 of the comparative example 2 and the photoelectric conversion layer 32 of the bottom cell 3 of the embodiment are considered to have an equal silicon density (2.267 g/cm$^3$), because the conditions for forming the photoelectric conversion layer 32 of the bottom cell 3 of the comparative example 2 are the same as the conditions for forming the photoelectric conversion layer 32 of the bottom cell 3 of the above-mentioned embodiment. Therefore, a measurement was not made of silicon density of the photoelectric conversion layer 32 of the bottom cell 3 of the comparative example 2.

TABLE 7

| | Silicon density of photoelectric conversion layer (g/cm$^3$) | |
|---|---|---|
| | Front cell | Bottom cell |
| Comparative example 2 | 2.231 | 2.267 |

Referring to Table 7, the silicon density of the photoelectric conversion layer (the amorphous silicon layer) 142 of the front cell 14 of the comparative example 2 was 2.231 g/cm$^3$. The result has shown that, in the comparative example 2, the silicon density (2.267 g/cm$^3$) of the photoelectric conversion layer (the microcrystalline silicon layer) 32 of the bottom cell 3 is higher than the silicon density (2.231 g/cm$^3$) of the photoelectric conversion layer (the amorphous silicon layer) 142 of the front cell 14.

(Common to Embodiment and Comparative Example 1)

(Output Characteristic Test)

Next, output characteristic tests were carried out on the respective stacked photovoltaic devices of the embodiment and the comparative example 1 fabricated in the manner as above mentioned. In the output characteristic tests, measurements were first made of initial characteristics (a conversion efficiency, an open-circuit voltage, a short-circuit current and a fill factor) under conditions of pseudo-sunlight exposure where an optical spectrum was of AM 1.5, a light intensity was 100 mW/cm$^2$, and a measuring temperature was 25 degrees. Next, each of the stacked photovoltaic devices of the embodiment and the comparative example 1, with open contacts between terminals, were exposed to light for 160 minutes under conditions where the optical spectrum was of AM 1.5, the light intensity was 500 mW/cm$^2$, and the temperature was 25 degrees. This exposure caused photodegradation in each of the stacked photovoltaic devices of the embodiment and the comparative example 1. Next, measurements were again made on the photodeteriorated stacked photovoltaic devices of the embodiment and the comparative example 1 under the same conditions as the above measurement conditions for the initial characteristics, to determine characteristics (a conversion efficiency, an open-circuit voltage, a short-circuit current and a fill factor) after the photodegradation. The measurement results of the embodiment and the comparative example 1 are shown in Tables 8 and 9, respectively, as given below.

In each of Tables 8 and 9, the initial characteristics (a normalized open-circuit voltage, a normalized short-circuit current and a normalized fill factor) of the bottom cell are values which are normalized using the initial characteristics (the open-circuit voltage, the short-circuit current and the fill factor) of the front cell as references ("1.00"). Moreover, the characteristics (normalized open-circuit voltages, normalized short-circuit currents and normalized fill factors) of the front cell and the bottom cell after the photodegradation are also values which are normalized using the initial characteristics (the open-circuit voltage, the short-circuit current and the fill factor) of the front cell as the references ("1.00"). Furthermore, in each of Tables 8 and 9, the normalized open-circuit voltage of the stacked photovoltaic device is a sum of the normalized open-circuit voltage of the front cell and the normalized open-circuit voltage of the bottom cell. The normalized short-circuit current of the stacked photovoltaic device is the lower current of the normalized short-circuit currents of the front cell and the bottom cell. The normalized fill factor of the stacked photovoltaic device is the lower fill factor of the normalized fill factors of the front cell and the bottom cell. In Table 8, the normalized open-circuit voltages and the normalized fill factors of the bottom cell and the front cell are determined in the following procedures: measuring the open-circuit voltages and the fill factors of each of the bottom cell alone and the front cell alone, which are formed under the same conditions of formation as the conditions for the bottom cell 3 and the front cell 4 shown in FIG. 1, respectively, and have the same structures as the bottom cell 3 and the front cell 4, respectively; and normalizing the measured values with reference to the initial characteristics of the front cell of the embodiment. Moreover, in Table 8, the normalized short-circuit currents of the bottom cell and the front cell are determined in the following procedures: measuring collection efficiencies of each of the bottom cell 3 and the front cell 4 of the stacked photovoltaic device shown in FIG. 1; calculating the short-circuit currents based on the measured values; and normalizing the short-circuit current values with reference to the initial characteristics of the front cell. In Table 9, the normalized open-circuit voltages and the normalized fill factors of the bottom cell and the front cell are determined in the following procedures: measuring the open-circuit voltages and the fill factors of the bottom cell alone and the front cell alone, which are formed under the same conditions of formation as the conditions for the bottom cell 13 and the front cell 4 shown in FIG. 2, respectively, and have the same structures as the bottom cell 13 and the front cell 4, respectively; and normalizing the measured values with reference to the initial characteristics of the front cell of the embodiment. In Table 9, the normalized short-circuit currents of the bottom cell and the front cell are determined in the following procedures: measuring the collection efficiencies of each of the bottom cell 13 and the front cell 4 of the stacked photovoltaic device shown in FIG. 2; calculating the short-circuit current values based on the measured values; and normalizing the short-circuit current values with reference to the initial characteristics of the front cell of the embodiment.

tric conversion layer 42 of the front cell 4. The comparison has shown that the rate of photodegradation of the stacked photovoltaic device of the embodiment is lower than the rate of photodegradation of the stacked photovoltaic device of the comparative example 1. Specifically, the normalized conversion efficiency of the stacked photovoltaic device of the embodiment declined from 1.45 (the initial characteristic) to 1.32 (the characteristic after the photodegradation), which means that the decreasing rate in the conversion efficiency was 9.0%. On the other hand, the normalized conversion efficiency of the stacked photovoltaic device of the comparative example 1 declined from 1.53 (the initial characteristic) to 1.32 (the characteristic after the photodegradation), which means that the decreasing rate in the conversion efficiency was 13.7%.

Moreover, the normalized fill factor of the stacked photovoltaic device of the embodiment changed from 0.95 (the initial characteristic) to 0.87 (the characteristic after the photodegradation), whereas the normalized fill factor of the stacked photovoltaic device of the comparative example 1 changed from 1.00 (the initial characteristics) to 0.87 (the characteristics after the photodegradation).

TABLE 8

| Embodiment | | Normalized open-circuit voltage | Normalized short-circuit current | Normalized fill factor | Normalized conversion efficiency |
|---|---|---|---|---|---|
| Initial characteristics | Front cell | 1.00 | 1.00 | 1.00 | — |
| | Bottom cell | 0.53 | 1.10 | 0.95 | — |
| | Stacked photovoltaic device | 1.53 | 1.00 | 0.95 | 1.45 |
| Characteristics after photodegradation | Front cell | 0.97 | 1.00 | 0.87 | — |
| | Bottom cell | 0.53 | 1.10 | 0.90 | — |
| | Stacked photovoltaic device | 1.50 | 1.00 | 0.87 | 1.32 |
| Rate of photodegradation (Rate of decrease in conversion efficiency) | | $((1.45 - 1.32)/1.45) \times 100 = 9.0\%$ | | | |

TABLE 9

| Comparative example 1 | | Normalized open-circuit voltage | Normalized short-circuit current | Normalized fill factor | Normalized conversion efficiency |
|---|---|---|---|---|---|
| Initial characteristics | Front cell | 1.00 | 1.00 | 1.00 | — |
| | Bottom cell | 0.53 | 1.10 | 1.00 | — |
| | Stacked photovoltaic device | 1.53 | 1.00 | 1.00 | 1.53 |
| Characteristics after photodegradation | Front cell | 0.97 | 1.00 | 0.87 | — |
| | Bottom cell | 0.53 | 1.10 | 1.00 | — |
| | Stacked photovoltaic device | 1.50 | 1.00 | 0.87 | 1.32 |
| Rate of photodegradation (Rate of decrease in conversion efficiency) | | $((1.53 - 1.32)/1.53) \times 100 = 13.7\%$ | | | |

Referring to Tables 8 and 9, as to the stacked photovoltaic device in which the silicon density of the photoelectric conversion layer 42 of the front cell 4 is set at 2.315 g/cm$^3$, comparison is made between the embodiment in which the silicon density (2.267 g/cm$^3$) of the photoelectric conversion layer 32 of the bottom cell 3 is lower than the silicon density of the photoelectric conversion layer 42 of the front cell 4, and the comparative example 1 in which the silicon density (2.323 g/cm$^3$) of the photoelectric conversion layer 132 of the bottom cell 13 is higher than the silicon density of the photoelec- From these results, it is conceivable that the initial conversion efficiency of the stacked photovoltaic device of the embodiment was lower than that of the comparative example 1, because the initial fill factor of the stacked photovoltaic device of the embodiment was lower than that of the comparative example 1. It is thus conceivable that the decreasing rate in the conversion efficiency of the stacked photovoltaic device of the embodiment was lower than that of the comparative example 1, because the initial conversion efficiency of the stacked photovoltaic device of the embodiment was lower than that of the comparative example 1.

Referring to Tables 8 and 9, the normalized fill factor of the bottom cell 3 of the embodiment changed from 0.95 (the initial characteristics) to 0.90 (the characteristic after the photodegradation), whereas the normalized fill factor of the bottom cell 13 of the comparative example 1 remained at 1.00. From these results, it is conceivable that the initial fill factor of the stacked photovoltaic device of the embodiment was lower than that of the comparative example 1, because the initial fill factor of the bottom cell 3 of the embodiment was lower than that of the bottom cell 13 of the comparative example 1. The reason why the initial fill factor of the bottom cell 3 of the embodiment was lower than that of the bottom cell 13 of the comparative example 1 can be considered to be because an amount of impurities incorporated in the photoelectric conversion layer 32 of the bottom cell 3 of the embodiment was larger than the amount of impurities incorporated in the photoelectric conversion layer 132 of the bottom cell 13 of the comparative example 1.

Referring to Table 8, in the front cell 4 of the embodiment, the normalized open-circuit voltage changed from 1.00 (the initial characteristic) to 0.97 (the characteristic after the photodegradation); the normalized short-circuit current remained at 1.00; the normalized fill factor changed from 1.00 (the initial characteristic) to 0.87 (the characteristic after the photodegradation). On the other hand, in the bottom cell 3 of the embodiment, the normalized open-circuit voltage remained at 0.53; the normalized short-circuit current remained at 1.10. These results have confirmed that the microcrystalline silicon layer constituting the photoelectric conversion layer 32 of the bottom cell 3 is less prone to undergo photodegradation than the amorphous silicon layer constituting the photoelectric conversion layer 42 of the front cell 4. However, the normalized fill factor of the bottom cell 3 of the embodiment changed from 0.95 (the initial characteristics) to 0.90 (the characteristic after the photodegradation), as mentioned above.

Figure 4:
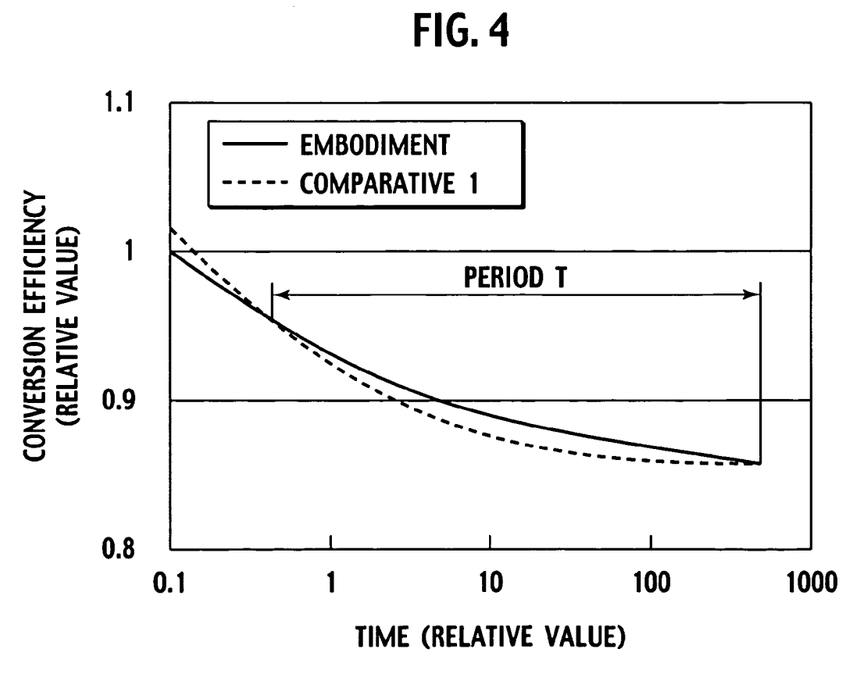
FIG. 4 is a graph showing a change with time in the conversion efficiency of the stacked photovoltaic devices.

FIG. 4 is a graph showing a change with time in the conversion efficiency of the stacked photovoltaic devices. The description will now be given with reference to FIG. 4 with regard to a relation between time and the conversion efficiencies of each of the stacked photovoltaic devices of the embodiment and the comparative example 1.

As shown in FIG. 4, it has become clear that the conversion efficiency of the stacked photovoltaic device of the embodiment falls more slowly with time, as compared to that of the stacked photovoltaic device of the comparative example 1. Thus, the conversion efficiency of the embodiment can be considered to be higher than that of the comparative example 1 at a time T after a lapse of a predetermined time from a time of an initial state, even if the initial conversion efficiency of the embodiment is lower than that of the comparative example 1.

(Common to Embodiment and Comparative Example 2)
(Output Characteristic Test)

Next, the same output characteristic tests as the above-described output characteristic tests performed with regard to the embodiment and the comparative example 1 were also carried out on the stacked photovoltaic device of the comparative example 2 fabricated in the manner as previously mentioned. Note that as for the embodiment, the measurement results shown in the above Table 8 were used. The measurement results of the comparative example 2 are shown in Table 10 as given below.

In Table 10, the characteristics (normalized open-circuit voltages, normalized short-circuit currents and normalized fill factors) of the front cell and the bottom cell are values which are normalized using the initial characteristics (the open-circuit voltage, the short-circuit current and the fill factor) of the front cell of the embodiment shown in Table 8 as references ("1.00"). In Table 10, the normalized open-circuit voltage of the stacked photovoltaic device is a sum of the normalized open-circuit voltage of the front cell and the normalized open-circuit voltage of the bottom cell. The normalized short-circuit current of the stacked photovoltaic device is the lower current of the normalized short-circuit currents of the front cell and the bottom cell. The normalized fill factor of the stacked photovoltaic device is the lower fill factor of the normalized fill factors of each of the front cell and the bottom cell. Note that in Table 10, the normalized open-circuit voltages and normalized fill factors of the bottom cell and the front cell are determined in the following procedures: measuring the open-circuit voltages and fill factors of each of the bottom cell alone and the front cell alone, which are formed under the same conditions of formation as the conditions for the bottom cell 3 and the front cell 14 shown in FIG. 3, respectively, and have the same structures as the bottom cell 3 and the front cell 14, respectively; and normalizing the measured values with reference to the initial characteristics of the front cell of the embodiment. In Table 10, the normalized short-circuit currents of the bottom cell and the front cell are determined in the following procedures: measuring the collection efficiencies of the bottom cell 3 and the front cell 14 of the stacked photovoltaic device shown in FIG. 3; calculating the short-circuit current values based on the measured values; and normalizing the short-circuit current values with reference to the initial characteristics of the front cell of the embodiment.

TABLE 10

| Comparative example 2 | | Normalized open-circuit voltage | Normalized short-circuit current | Normalized fill factor | Normalized conversion efficiency |
|---|---|---|---|---|---|
| Initial characteristics | Front cell | 0.95 | 0.95 | 0.95 | — |
| | Bottom cell | 0.53 | 1.10 | 0.95 | — |
| | Stacked photovoltaic device | 1.48 | 0.95 | 0.95 | 1.34 |
| Characteristics after photodegradation | Front cell | 0.92 | 0.95 | 0.82 | — |
| | Bottom cell | 0.53 | 1.10 | 0.90 | — |
| | Stacked photovoltaic device | 1.45 | 0.95 | 0.82 | 1.13 |
| Rate of photodegradation (Rate of decrease in conversion efficiency) | | ((1.34 − 1.13)/1.34) × 100 = 15.7% | | | |

Referring to Tables 8 and 10, as to the stacked photovoltaic device in which the silicon density of the photoelectric conversion layer 32 of the bottom cell 3 is set at 2.267 g/cm$^3$, comparison is made between the embodiment in which the silicon density (2.315 g/cm$^3$) of the photoelectric conversion layer 42 of the front cell 4 is higher than the silicon density of the photoelectric conversion layer 32 of the bottom cell 3, and the comparative example 2 in which the silicon density (2.231 g/cm$^3$) of the photoelectric conversion layer 142 of the front cell 14 is lower than the silicon density of the photoelectric conversion layer 32 of the bottom cell 3. The comparison has shown that the rate of photodegradation of the stacked photovoltaic device of the embodiment is lower than the rate of photodegradation of the stacked photovoltaic device of the comparative example 2. Specifically, the normalized conversion efficiency of the stacked photovoltaic device of the embodiment declined from 1.45 (the initial characteristic) to 1.32 (the characteristic after the photodegradation), which means that the decreasing rate in the conversion efficiency was 9.0%. On the other hand, the normalized conversion efficiency of the stacked photovoltaic device of the comparative example 2 declined from 1.34 (the initial characteristic) to 1.13 (the characteristic after the photodegradation), which means that the decreasing rate in the conversion efficiency was 15.7%.

Moreover, the normalized open-circuit voltage of the front cell 4 of the embodiment changed from 1.00 (the initial characteristic) to 0.97 (the characteristic after the photodegradation), whereas the normalized open-circuit voltage of the front cell 14 of the comparative example 2 changed from 0.95 (the initial characteristic) to 0.92 (the characteristic after the photodegradation). The normalized short-circuit current of the front cell 4 of the embodiment remained at 1.00, whereas the normalized short-circuit current of the front cell 14 of the comparative example 2 remained at 0.95. The normalized fill factor of the front cell 4 of the embodiment changed from 1.00 (the initial characteristic) to 0.87 (the characteristic after the photodegradation), whereas the normalized fill factor of the front cell 14 of the comparative example 2 changed from 0.95 (the initial characteristic) to 0.82 (the characteristic after the photodegradation).

From these results, it is conceivable that, in the comparative example 2, a low silicon density of the photoelectric conversion layer 142 of the front cell 14 increased an amount of impurities incorporated in the photoelectric conversion layer 142, thus resulting in the front cell 14 alone having excessively low initial characteristics (the open-circuit voltage, the short-circuit current and the fill factor). It is thus conceivable that the decreasing rate in the conversion efficiency of the stacked photovoltaic device of the comparative example 2 was higher than that of the embodiment, because the characteristics of the front cell 14, which had been low in initial states, became still lower due to photodegradation.

Figure 5:
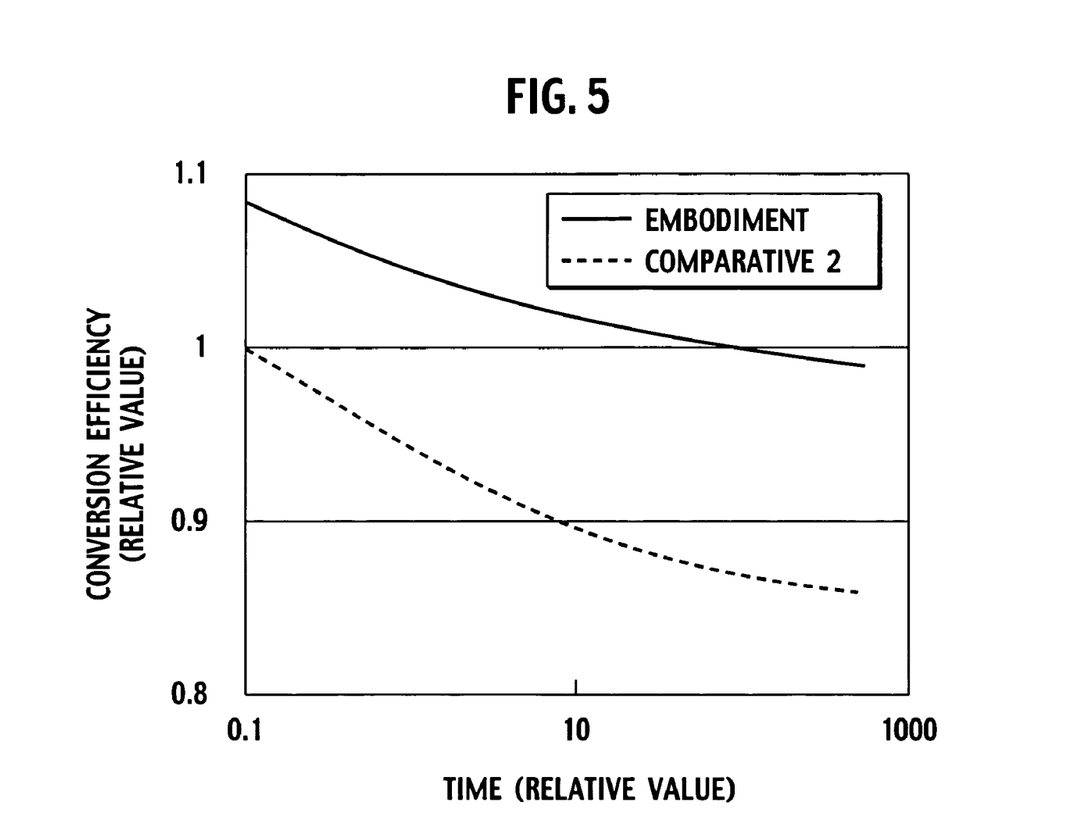
FIG. 5 is a graph showing a change with time in the conversion efficiency of the stacked photovoltaic devices.

FIG. 5 is a graph showing a change with time in the conversion efficiency of the stacked photovoltaic devices. The description will now be given with reference to FIG. 5 with regard to a relation between time and the conversion efficiencies of each of the stacked photovoltaic devices of the embodiment and the comparative example 2.

As shown in FIG. 5, it has been confirmed that the initial conversion efficiency of the stacked photovoltaic device of the embodiment is higher than that of the stacked photovoltaic device of the comparative example 2. It has also became clear that the conversion efficiency of the stacked photovoltaic device of the embodiment falls more slowly with time, as compared to that of the stacked photovoltaic device of the comparative example 2.

In the embodiment of the present invention, as described above, the front cell 4 including the photoelectric conversion layer 42 made of the amorphous silicon layer is formed on the bottom cell 3 including the photoelectric conversion layer 32 made of the microcrystalline silicon layer. Moreover, the silicon density (2.267 g/cm$^3$) of the photoelectric conversion layer 32, which is made of the microcrystalline silicon layer, of the bottom cell 3 is caused to be lower than the silicon density (2.315 g/cm$^3$) of the photoelectric conversion layer 42, which is made of the amorphous silicon layer, of the front cell 4. Thereby, the amount of impurities incorporated in the photoelectric conversion layer 32, which has a low silicon density, of the bottom cell 3 is increased in the embodiment, thus lowering the initial characteristics of the bottom cell 3 alone including the photoelectric conversion layer 32 made of the microcrystalline silicon layer. Thus, it is possible to preset, at low values, the initial output characteristics of the entire stacked photovoltaic device which are determined according to a balance between the respective characteristics of the bottom cell 3 and the front cell 4. Therefore, it is possible to reduce the rate of photodegradation of the output characteristics regarding the stacked photovoltaic device which includes the bottom cell 3 and the front cell 4, because the initial output characteristics of the entire stacked photovoltaic device are preset at low values, even if there is a rise in the decreasing rate, due to the photodegradation, of the characteristics of the front cell 4 alone which includes the photoelectric conversion layer 42 made of the amorphous silicon layer that is prone to photodegradation. Thus, a slow decline in the output characteristics of the stacked photovoltaic device is enabled, and also a reduction in the range of variation in the output characteristics of the stacked photovoltaic device is enabled, in a long-term use of the stacked photovoltaic device.

Moreover, in the embodiment of the present invention, the microcrystalline silicon layer that is not prone to photodegradation is used as the photoelectric conversion layer 32 of the bottom cell 3. Thereby, it is possible to prevent an occurrence of a disadvantage of excessively reducing the initial characteristics of the bottom cell 3 alone including the photoelectric conversion layer 32, even if there is an increase in the amount of impurities incorporated in the photoelectric conversion layer 32.

Moreover, in the embodiment of the present invention, the microcrystalline silicon layer is used as the photoelectric conversion layer 32 of the bottom cell 3, and the amorphous silicon layer is used as the photoelectric conversion layer 42 of the front cell 4. Thereby, the rate of photodegradation of the photoelectric conversion layer 32 of the bottom cell 3 is lower than the rate of photodegradation of the photoelectric conversion layer 42 of the front cell 4. Therefore, even when the silicon density of the photoelectric conversion layer (the microcrystalline silicon layer) 32 of the bottom cell 3 is reduced to lower the initial characteristics and the rate of photodegradation of the bottom cell 3 alone, the decreased rate of photodegradation of the bottom cell 3 alone which has a low rate of photodegradation has little effect on the rate of photodegradation of the entire stacked photovoltaic device, whereas the lowered initial characteristics of the bottom cell 3 alone have an effect of reducing the rate of photodegradation of the entire stacked photovoltaic device. Thus, it is possible to easily reduce the rate of photodegradation of the entire stacked photovoltaic device.

It should be understood that the embodiment disclosed herein is illustrative in all regards and not restrictive. The scope of the present invention is indicated by the appended claims rather than by the above-mentioned description of the embodiment, and all changes that come within meaning and range of equivalency of the claims are therefore intended to be embraced therein.

For example, in the above-mentioned embodiment, the silicon density of the photoelectric conversion layer of the bottom cell was set at 2.267 g/cm$^3$, and the silicon density of the photoelectric conversion layer of the front cell is set at 2.315 g/cm$^3$. However, the present invention is not limited to this, and any silicon density may be set, provided that the silicon density of the photoelectric conversion layer of the bottom cell is lower than the silicon density of the photoelectric conversion layer of the front cell.

The embodiment has been described above giving an example in which the present invention is applied to the stacked photovoltaic device including the bottom cell which acts as the microcrystalline silicon system power generating unit, and the front cell which acts as the amorphous silicon system power generating unit, which are stacked in sequence on the substrate thereof. However, the present invention is not limited to this. The bottom cell (the cell located at a substrate side) may act as the amorphous silicon system power generating unit. Moreover, three or more cells (power generating units) may be stacked on the substrate, when the front cell (the cell located a light incident side) acts as the amorphous silicon system power generating unit.

In the above-mentioned embodiment, the substrate which is formed of the stainless steel sheet and the resin layer made of polyimide resin formed thereon is used. However, the present invention is not limited to this. Metals such as iron (Fe), molybdenum (Mo) or aluminum (Al), or an alloy material of these metals may be used in place of the stainless steel sheet. Moreover, insulating materials such as polyethersulfone (PES) resin or silicon dioxide ($SiO_2$) may be used in place of the polyimide resin. Note that any combination of the metals and insulating materials mentioned above may be used.

In the above-mentioned embodiment, the substrate having the flat surface, which is formed of the flat stainless steel sheet and the resin layer formed thereon, is used. However, the present invention is not limited to this. The substrate may have a surface with an uneven shape, which is formed by mixing particles composed of silicon dioxide, titanium dioxide ($TiO_2$) or the like, with a diameter of a few hundreds of micrometers (μm), into the resin layer on the stainless steel sheet. In this case, the rear face electrode formed on the substrate has an uneven surface which reflects the uneven surface of the substrate. Consequently, the uneven surface of the rear face electrode allows incident light to be scattered, thus achieving a good optical confinement effect.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A stacked photovoltaic device, comprising:
    a first power generating unit including a first semiconductor layer which functions as a photoelectric conversion layer; and
    a second power generating unit formed above the first power generating unit, the second power generating unit including a second semiconductor layer made of a substantially intrinsic non-crystalline semiconductor which functions as a photoelectric conversion layer,
    wherein a density of a main constituent element of the first semiconductor layer of the first power generating unit is lower than a density of a main constituent element of the second semiconductor layer of the second power generating unit.

2. The stacked photovoltaic device as claimed in claim 1, wherein the first semiconductor layer is made of a substantially intrinsic non-single crystal.

3. The stacked photovoltaic device as claimed in claim 1, wherein the first semiconductor layer is made of a microcrystalline semiconductor.

4. The stacked photovoltaic device as claimed in claim 1, further comprising:
    a third power generating unit formed on the first power generating unit, the third power generating unit including a third semiconductor layer which functions as a photoelectric conversion layer,
    wherein the density of the main constituent element of the first semiconductor layer of the first power generating unit is lower than a density of a main constituent element of the third semiconductor layer of the third power generating unit.

5. The stacked photovoltaic device as claimed in claim 1, wherein the first semiconductor layer of the first power generating unit and the second semiconductor layer of the second power generating unit each include silicon (Si).

6. The stacked photovoltaic device as claimed in claim 1, wherein the first semiconductor layer which functions as the photoelectric conversion layer of the first power generating unit comprises a microcrystalline semiconductor layer,
    the second semiconductor layer which functions as the photoelectric conversion layer of the second power generating unit comprises a non-crystalline semiconductor layer, and
    the second power generating unit is located at a light incident side of said stacked photovoltaic device, as compared to the first power generating unit.

7. The stacked photovoltaic device as claimed in claim 1, wherein a rate of photodegradation of the first semiconductor layer which functions as the photoelectric conversion layer of the first power generating unit is lower than a rate of photodegradation of the second semiconductor layer which functions as the photoelectric conversion layer of the second power generating unit.

8. The stacked photovoltaic device as claimed in claim 2, wherein the non-single crystal semiconductor layer has a plurality of crystals of the element mainly constituting the first semiconductor layer.

9. The stacked photovoltaic device as claimed in claim 1, wherein the non-crystalline semiconductor layer is amorphous.

* * * * *